US012608293B2

(12) United States Patent
Liu et al.

(10) Patent No.: US 12,608,293 B2
(45) Date of Patent: Apr. 21, 2026

(54) METHOD FOR CONTROLLING LIQUID INGRESS DETECTION AND ELECTRONIC DEVICE

(71) Applicant: HONOR DEVICE CO., LTD., Shenzhen (CN)

(72) Inventors: Liang Liu, Shenzhen (CN); Dawei Li, Shenzhen (CN); Chao Han, Shenzhen (CN); Houxin Li, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 351 days.

(21) Appl. No.: 18/267,217

(22) PCT Filed: Dec. 30, 2022

(86) PCT No.: PCT/CN2022/143716
§ 371 (c)(1),
(2) Date: Jun. 14, 2023

(87) PCT Pub. No.: WO2023/165251
PCT Pub. Date: Sep. 7, 2023

(65) Prior Publication Data
US 2024/0184680 A1      Jun. 6, 2024

(30) Foreign Application Priority Data

Mar. 3, 2022      (CN) .......................... 202210200493.8

(51) Int. Cl.
*G01R 31/52* (2020.01)
*G01R 31/69* (2020.01)
*G06F 11/30* (2006.01)

(52) U.S. Cl.
CPC .......... *G06F 11/3058* (2013.01); *G01R 31/52* (2020.01); *G01R 31/69* (2020.01); *G06F 11/3055* (2013.01)

(58) Field of Classification Search
CPC ............. G06F 11/3058; G06F 11/3055; G06F 2213/0042; G01R 31/52; G01R 31/69;
(Continued)

(56) References Cited

U.S. PATENT DOCUMENTS 9,157,880 B2 * 10/2015 Stevens ................. H02H 5/083
11,133,623 B2 9/2021 Tyrrell et al.
(Continued)

FOREIGN PATENT DOCUMENTS

CN      108268388 A      7/2018
CN      108536055 A      9/2018
(Continued)

*Primary Examiner* — Yongjia Pan
(74) *Attorney, Agent, or Firm* — WOMBLE BOND DICKINSON (US) LLP

(57)      ABSTRACT

A method for controlling liquid ingress detection and an electronic device are provided. The method includes: controlling a liquid ingress detection circuit to start liquid ingress detection in a Type-C interface; stopping applying a voltage to first data pins when a detection result of the liquid ingress detection is that liquid ingress occurs in the Type-C interface, and obtaining a first parameter of a screen of the electronic device; when the first parameter of the screen is a screen-off state, controlling the liquid ingress detection circuit to start next liquid ingress detection in the Type-C interface after first duration; and when the first parameter of the screen is a screen-on state, controlling the liquid ingress detection circuit to start next liquid ingress detection in the Type-C interface after second duration, where the first duration is greater than the second duration.

14 Claims, 4 Drawing Sheets

(58) Field of Classification Search
CPC .......... G01M 3/16; G01M 3/40; G01M 3/181;
Y02D 30/70; H02J 7/04; H02J 7/0029;
H02J 7/0031; H02J 7/0047; Y02E 60/10;
G01N 27/048; G01N 27/06; H01R
13/6683; H01R 2201/20; H02H 5/083;
H02H 1/0007; H04M 1/72454
See application file for complete search history.

(56) References Cited

U.S. PATENT DOCUMENTS

| | | | |
|---|---|---|---|
| 11,566,964 B2 | 1/2023 | Zhang et al. | |
| 11,658,494 B2 * | 5/2023 | Si ...................... | H02J 7/007192 |
| | | | 320/107 |
| 2018/0181509 A1 | 6/2018 | Jo | |
| 2019/0011386 A1 | 1/2019 | Park et al. | |
| 2019/0181590 A1 | 6/2019 | Bae et al. | |
| 2019/0302047 A1 | 10/2019 | Park et al. | |
| 2021/0305805 A1 | 9/2021 | Kim et al. | |

FOREIGN PATENT DOCUMENTS

| | | | | | |
|---|---|---|---|---|---|
| CN | 108879598 | A | 11/2018 | | |
| CN | 109491941 | A | 3/2019 | | |
| CN | 109726157 | A | 5/2019 | | |
| CN | 109977057 | A | 7/2019 | | |
| CN | 110046117 | A | 7/2019 | | |
| CN | 110554240 | A | 12/2019 | | |
| CN | 111026684 | A | 4/2020 | | |
| CN | 111163203 | A | 5/2020 | | |
| CN | 111381118 | A | 7/2020 | | |
| CN | 111480152 | A | 7/2020 | | |
| CN | 111752362 | A | 10/2020 | | |
| CN | 111868535 | A | 10/2020 | | |
| CN | 113871921 | A | 12/2021 | | |
| CN | 215641865 | U | 1/2022 | | |
| CN | 114064381 | A | 2/2022 | | |
| CN | 114264423 | A | 4/2022 | | |
| EP | 3617842 | A1 * | 3/2020 | ............... | G06F 3/00 |
| KR | 20180109593 | A * | 10/2018 | ........ | H04M 1/72577 |
| KR | 20190070830 | A * | 6/2019 | ............. | G01R 31/04 |
| WO | WO-2022022401 | A1 * | 2/2022 | ............... | G01V 3/00 |

* cited by examiner

CC pin

METHOD FOR CONTROLLING LIQUID INGRESS DETECTION AND ELECTRONIC DEVICE

CROSS-REFERENCE TO RELATED APPLICATIONS

This application is a national stage of International Application No. PCT/CN2022/143716, filed on Dec. 30, 2022, which claims priority to Chinese Patent Application No. 202210200493.8, filed on Mar. 3, 2022. The disclosures of both of the aforementioned applications are hereby incorporated by reference in their entireties.

TECHNICAL FIELD

This application relates to the field of control, and in particular to a method for controlling liquid ingress detection and an electronic device.

BACKGROUND

Many electronic devices use Type-C interfaces as interfaces for charging and/or data transfer. At present, in some cases, the electronic devices cannot recognize other devices connected to the Type-C interfaces of the electronic devices timely, and cannot further communicate with the other devices.

SUMMARY

Embodiments of this application provide a method for controlling liquid ingress detection and an electronic device, to recognize a device connected to a Type-C interface timely.

According to a first aspect, an embodiment of this application provides a method for controlling liquid ingress detection applied to an electronic device. The electronic device includes a Type-C interface, a liquid ingress detection circuit, and a device recognition circuit. The liquid ingress detection circuit is configured to perform liquid ingress detection in the Type-C interface by applying a voltage to first data pins of the Type-C interface. The device recognition circuit is configured to recognize a device connected to the Type-C interface on the condition that a voltage is applied to the first data pins. The method includes:

controlling the liquid ingress detection circuit to start the liquid ingress detection in the Type-C interface;

stopping applying a voltage to the first data pins when a detection result of the liquid ingress detection is that liquid ingress occurs in the Type-C interface, and obtaining a first parameter of a screen of the electronic device;

when the first parameter of the screen is a screen-off state, controlling the liquid ingress detection circuit to start next liquid ingress detection in the Type-C interface after first duration: and when the first parameter of the screen is a screen-on state, controlling the liquid ingress detection circuit to start next liquid ingress detection in the Type-C interface after second duration, where the first duration is greater than the second duration.

In this method, when the detection result of the liquid ingress detection is that liquid ingress occurs in the Type-C interface, applying a voltage to the first data pins is stopped, and the liquid ingress detection circuit is controlled to start next liquid ingress detection in the Type-C interface based on a difference in duration depending on whether the screen is on or off. Therefore, not only the liquid ingress detection can be performed, but also the device connected to the Type-C interface can be recognized timely.

In a possible implementation, before controlling the liquid ingress detection circuit to start next liquid ingress detection in the Type-C interface after second duration, the method further includes: obtaining a detection times, where the detection times is used to record, when the first parameter of the screen is a screen-on state, the number of times for which the liquid ingress detection circuit is controlled to start the liquid ingress detection in the Type-C interface: and determining that the detection times is less than or equal to a preset first value.

In a possible implementation, the method further includes: determining that the detection times is greater than the preset first value, and controlling the liquid ingress detection circuit to start next liquid ingress detection in the Type-C interface after third duration, where the third duration is greater than the second duration and less than or equal to the first duration.

In a possible implementation, the method further includes: when the detection result of the liquid ingress detection is that no liquid ingress occurs in the Type-C interface, controlling the liquid ingress detection circuit to start next liquid ingress detection in the Type-C interface.

In a possible implementation, the method further includes: when the detection result of the liquid ingress detection is that no liquid ingress occurs in the Type-C interface, clearing the detection times to zero.

In a possible implementation, the method further includes: when a screen-on interruption is detected by a preset application, controlling the liquid ingress detection circuit to start the liquid ingress detection in the Type-C interface.

In a possible implementation, the first data pins are CC pins.

According to a second aspect, an embodiment of this application provides an electronic device, including a Type-C interface, a liquid ingress detection circuit, a device recognition circuit, and a processor. The liquid ingress detection circuit is configured to perform liquid ingress detection in a Type-C interface by applying a voltage to first data pins of the Type-C interface. The device recognition circuit is configured to recognize a device connected to the Type-C interface on the condition that a voltage is applied to the first data pins. The processor is configured to perform the method for controlling liquid ingress detection according to any one of the first aspect.

BRIEF DESCRIPTION OF DRAWINGS

To describe the technical solutions in embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Terms used in implementations of this application are merely intended to explain specific embodiments of this application rather than limit this application.

Figure 1:
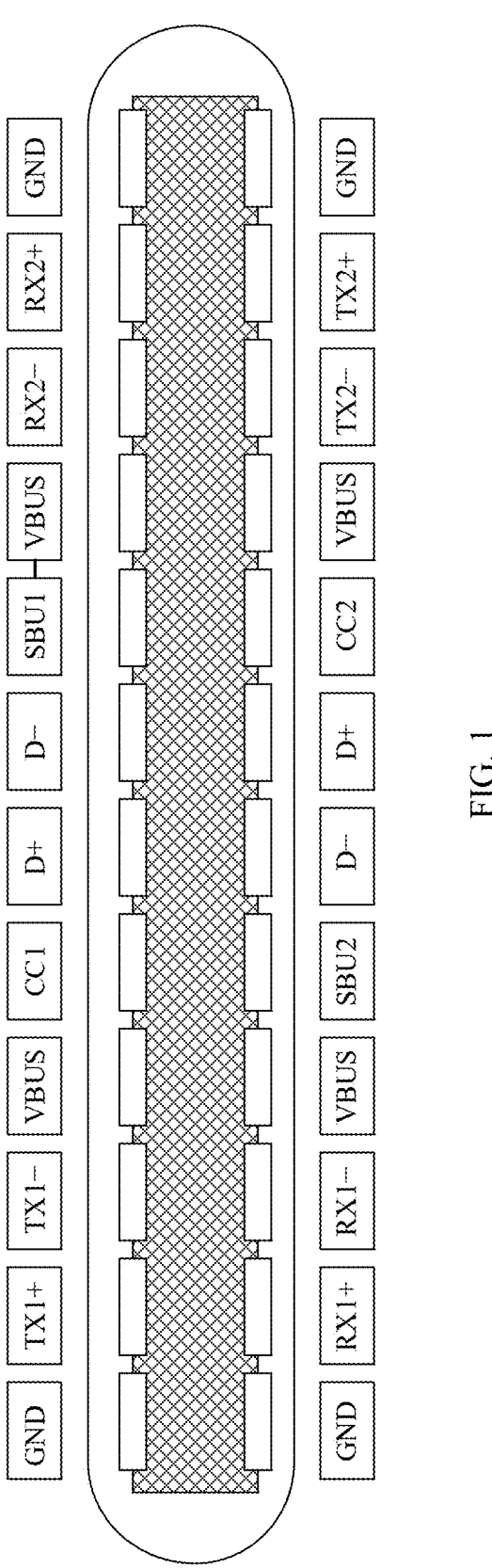
FIG. 1 is a schematic diagram of a structure of a Type-C interface.

Many electronic devices use Type-C interfaces as interfaces for charging and/or data transfer. FIG. 1 shows a schematic diagram of a structure of pins of a Type-C interface. The Type-C interface includes two CC pins, respectively called a CC1 pin and a CC2 pin, and further includes a plurality of pins such as a VBUS pin and a GND pin.

In an example, the CC pins in the Type-C interface are used both for liquid ingress detection in the Type-C interface and for recognizing a device (e.g. an OTG device and a headset) connected to the Type-C interface. The USB OTG (USB on-the-go) technology is used for data transfer between devices without a host (Host). OTG devices may be connected to each other via an OTG cable. Each OTG device may act as either a host (host) or a slave (slave).

The liquid ingress detection in the Type-C interface is to detect whether liquid ingress occurs in the Type-C interface, that is, to detect whether liquid has entered the Type-C interface.

Figure 2:
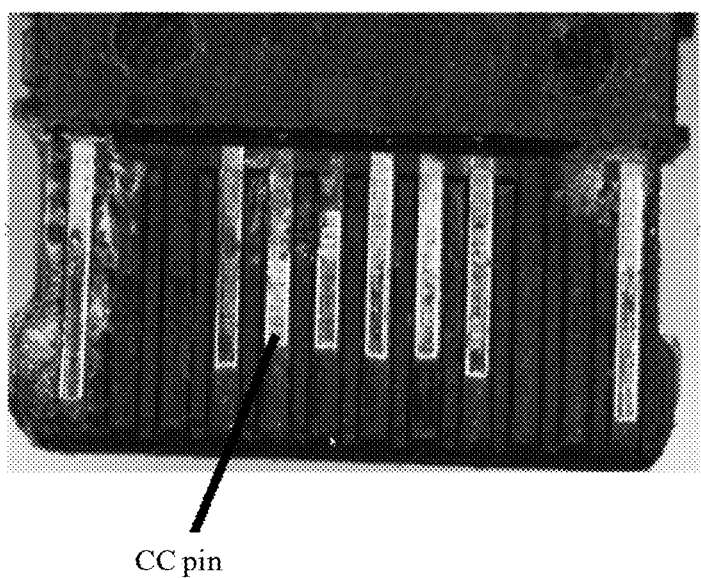
FIG. 2 is a schematic diagram of corroded CC pins in a Type-C interface.

If liquid ingress occurs in the Type-C interface, that is, liquid has entered the Type-C interface, which will lead to corrosion of some pins, especially the CC pins, in the Type-C interface. Refer to CC pins shown in FIG. 2, due to the corrosion, service life, performance, and the like of the Type-C interface, especially the CC pins, are affected. In an example, the liquid ingress detection in the Type-C interface may be implemented by applying a voltage to the CC pins, and the liquid ingress detection in the Type-C interface is continuously performed, which means that the electronic device continuously applies a voltage to the CC pins. Therefore, if liquid ingress occurs in the Type-C interface, the corrosion of the CC pins of the Type-C interface may be caused or aggravated because a voltage is continuously applied to the CC pins.

To this end, in another example, it is possible to stop applying a voltage to the CC pins when liquid ingress occurs in the Type-C interface, thereby alleviating the corrosion of the CC pins and other problems that may be caused by liquid ingress, and preventing the problem of corrosion aggravation of the CC pins caused by applying a voltage to the CC pins when liquid ingress occurs in the Type-C interface.

However, since the CC pins in the electronic device are also used for device recognition, the electronic device recognizes, based on a voltage change of the CC pins, a device connected to the Type-C interface. If the application of a voltage to the CC pins is stopped because liquid ingress occurs in the Type-C interface, after stopping applying voltages to the CC pins, the electronic device will fail to recognize the device connected to the Type-C interface.

To this end, this application provides a method for controlling liquid ingress detection, solving the problem that an OTG device cannot be recognized when the electronic device detects liquid ingress in the Type-C interface.

Figure 3:
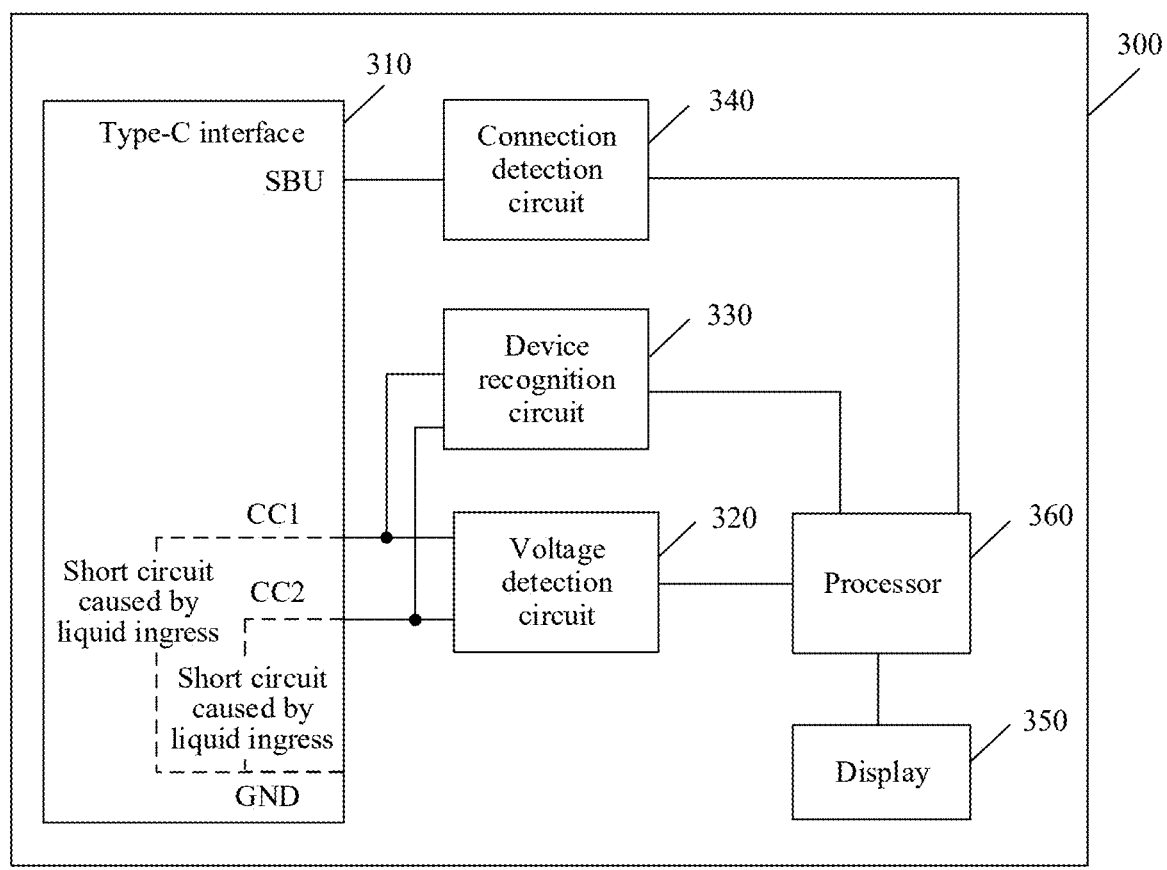
FIG. 3 is a schematic diagram of a structure of an electronic device according to an embodiment of this application.

FIG. 3 is a schematic diagram of a structure of an electronic device according to an embodiment of this application. The electronic device 300 includes: a Type-C interface 310, a voltage detection circuit 320, a device recognition circuit 330, a connection detection circuit 340, a display 350, and a processor 360.

The voltage detection circuit 320 has an input end connected to a CC pin and an output end connected to the processor 360. The voltage detection circuit 320 is configured to detect a magnitude relationship between a voltage of a CC1 pin and a reference voltage, and/or to detect a magnitude relationship between a voltage of a CC2 pin and a reference voltage.

The device recognition circuit 330 has an input end connected to the CC pin and an output end connected to the processor 360. The device recognition circuit 330 is configured to recognize a device connected to the Type-C interface, and send a recognition result to the processor 360.

The connection detection circuit 340 has an input end connected to a SBU pin and an output end connected to the processor 360. The connection detection circuit 340 is configured to detect whether there is a plug connected to the Type-C interface and send a detection result to the processor 360.

The display 350 is connected to the processor 360.

The processor 360 is configured to determine whether liquid ingress occurs in the Type-C interface based on the detection result of the voltage detection circuit 320, perform device recognition based on a processing result of the device recognition circuit 330, determine whether there is a plug connected to the Type-C interface based on the detection result of the connection detection circuit 340, and further configured to control the display 350.

In the electronic device shown in FIG. 3, the voltage detection circuit and the processor may be included in a liquid ingress detection circuit in the electronic device. It should be noted that FIG. 3 shows an example of the electronic device including a processor, and practically, the processor 360 may be a processor set included by a plurality of processors. If the processor 360 is implemented as a processor set, the foregoing functions of the processor 360 may be achieved by a same processor in the processor set or by different processors. This is not limited in the embodiments of this application.

An implementation principle that the liquid ingress detection circuit includes the voltage detection circuit and the processor in the electronic device shown in FIG. 3 is illustrated below by way of example.

The voltage detection circuit 320 in FIG. 3 detects the magnitude relationship between the voltage of the CC1 pin and the reference voltage, and/or, detects the magnitude relationship between the voltage of the CC2 pin and the reference voltage. Accordingly, the voltage detection circuit 320 sends the processor 360 the detection result of the magnitude relationship between the voltage of the CC1 pin and the reference voltage, and/or the magnitude relationship between the voltage of the CC2 pin and the reference voltage.

Accordingly, the processor 360 determines that liquid ingress occurs in the Type-C interface when the voltage of the CC1 pin is less than the reference voltage and/or the voltage of the CC2 pin is less than the reference voltage, otherwise, the processor determines that liquid ingress occurs in the Type-C interface.

To further improve accuracy of the liquid ingress detection, in an embodiment, the voltage detection circuit 320 may perform detection for n1 times on the magnitude relationship between the voltage of the CC1 pin and the reference voltage and/or the magnitude relationship between the voltage of the CC2 pin and the reference voltage, thereby obtaining n1 detection results.

Accordingly, the processor 360 may determine that liquid ingress occurs in the Type-C interface when n2 of the n1 detection results satisfy that the voltage of the CC1 pin is less than the reference voltage and/or the voltage of the CC2 pin is less than the reference voltage.

In this embodiment, the accuracy of the liquid ingress detection is improved by filtering detection results for a plurality of times to determine whether liquid ingress occurs in the Type-C interface.

Figure 4:
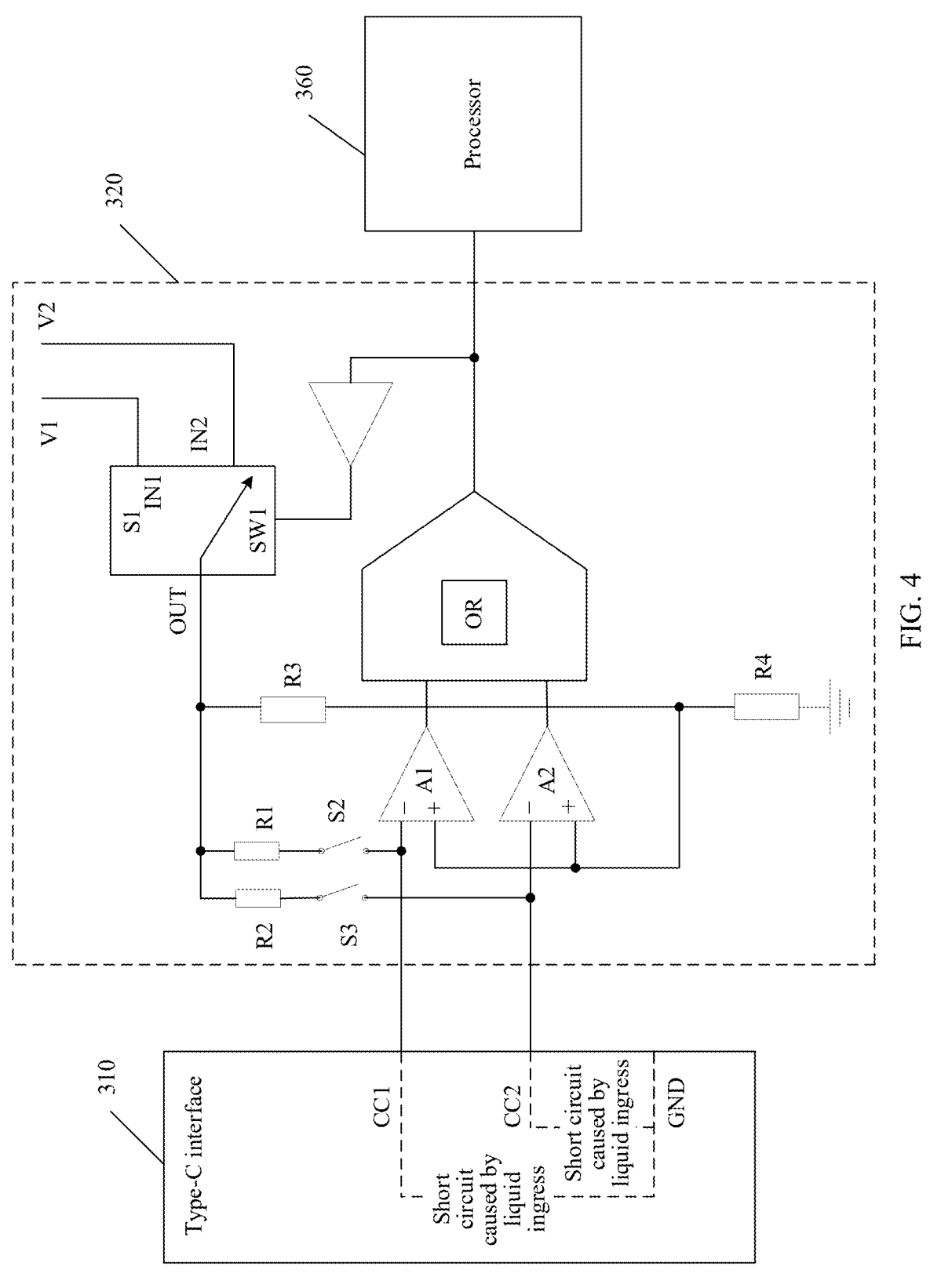
FIG. 4 is a schematic diagram of a structure of a liquid ingress detection circuit according to an embodiment of this application.

FIG. 4 is a schematic diagram of a structure of a voltage detection circuit 320 in an electronic device according to an embodiment of this application. It should be noted that FIG. 4 is used to illustrate a possible structure for implementation of the voltage detection circuit 320, and structures of the connection detection circuit, the device recognition circuit, and the like in the electronic device are omitted in the figure. As shown in FIG. 4, the voltage detection circuit 320 may include the following.

A first input end IN1 of a first switch S1 is connected to a first voltage end V1 and a second input end IN2 is connected to a second voltage end V2. A voltage at the first voltage end V1 is different from a voltage at the second voltage end V2. For example, the voltage at the first voltage end V1 may be 1.8V, and the voltage at the second voltage end V2 may be a system voltage, for example 5V.

An output end OUT of the first switch S1 is grounded through a third resistor R3 and a fourth resistor R4 that are connected in series, and is further connected to a first end of the voltage detection circuit 310 (i.e., an end connected to the CC1 pin of the Type-C interface) through a first resistor R1 and a second switch S2 that are connected in series, and connected to a second end of the voltage detection circuit 310 (i.e., an end connected to the CC2 pin of the Type-C interface) through a second resistor R2 and a third switch S3 that are connected in series.

The first end of the voltage detection circuit 310 is connected to an inverting input end of a first comparator A1.

The second end of the voltage detection circuit 310 is connected to an inverting input end of a second comparator A2.

A non-inverting input end of the first comparator A1 and a non-inverting input end of the second comparator A2 are connected to an ungrounded end of the fourth resistor R4.

An output end of the first comparator A1 and an output end of the second comparator A2 are respectively connected to two input ends of an OR gate correspondingly.

An output end of the OR gate is connected to a switch control end of the first switch S1 via a buffer, and further connected to a third end of the voltage detection circuit 310.

Optionally, an enable end of the first switch S1 may be connected to the processor 360 (not shown in FIG. 4), so that the processor 360 performs enabling control. The processor 360 is required to control the first switch S1 to operate when the voltage detection circuit 320 is required to operate, and controls the first switch S1 not to operate when the voltage detection circuit 320 is not required to operate. In this case, a voltage of the CC1 pin and/or a voltage of the CC2 pin are zero.

Optionally, a control end of the second switch S2 and a control end of the third switch S3 may be connected to the processor 360 (not shown in FIG. 4), respectively, and the processor 360 performs on/off control, so that the processor 360 controls the second switch S2 and the third switch S3 to be on when the voltage detection circuit is required to operate, and the processor 360 controls the second switch S2 and the third switch S3 to be off when the voltage detection circuit is not required to operate. The second switch S2 and third switch S3 may be implemented by switch tubes, respectively.

Optionally, resistance values of the first resistor R1, the second resistor R2, and the third resistor R3 may be the same, and an impedance of the fourth resistor R4 corresponds to a reference impedance. The reference impedance may be set based on a value interval of possible values of an impedance between the CC1 pin (or CC2 pin) and a GND pin when liquid ingress occurs in the Type-C interface. The impedance between the CC1 pin (or CC2 pin) and the GND pin is generally a value interval when liquid ingress occurs in the Type-C interface. The reference impedance may be a maximum value of the value interval, or may also be a value in the value interval.

An implementation principle of the voltage detection circuit in FIG. 4 is illustrated below:

In an initial state, the first switch S1 selects to connect a path between the first input end IN1 and the output end OUT, and the first voltage end V1 provides electric energy.

The first comparator A1 compares the voltage of the CC1 pin with the reference voltage. If the voltage of the CC1 pin is lower than the reference voltage, it indicates that there is liquid between the CC1 pin and the GND pin, and the first comparator A1 outputs a high level, otherwise, it indicates that there is no liquid between the CC1 pin and GND pin, and the first comparator A1 outputs a low level.

The second comparator A2 compares the voltage of the CC2 pin with the reference voltage. If the voltage of the CC2 pin is lower than the reference voltage, it indicates that there is liquid between the CC2 pin and the GND pin, and the second comparator A2 outputs a high level, otherwise, it indicates that there is no liquid between the CC2 pin and the GND pin, and the second comparator A2 outputs a low level.

When at least one of the first comparator A1 and the second comparator A2 outputs a high level, the OR gate outputs a high level.

The high level output by the OR gate is processed by the buffer and output to a switch control end SW of the first switch S1, the first switch S1 disconnects the path between the first input end IN1 and the output end OUT, and selects to connect a path between the second input end IN2 and the output end OUT, and the second voltage end V2 provides electric energy.

Since the first voltage end V1 and the second voltage end V2 have different voltages, when the first voltage end V1 and the second voltage end V2 provide electric energy, although an input end of the processor 360 receives high level signals, but the received high level signals have different voltage values, the processor 360 may determine, based on a specific voltage value of a received voltage signal, whether a voltage of at least one of the CC1 pin and the CC2 pin is lower than the reference voltage, so as to determine whether liquid ingress occurs in the Type-C interface.

Figure 5:
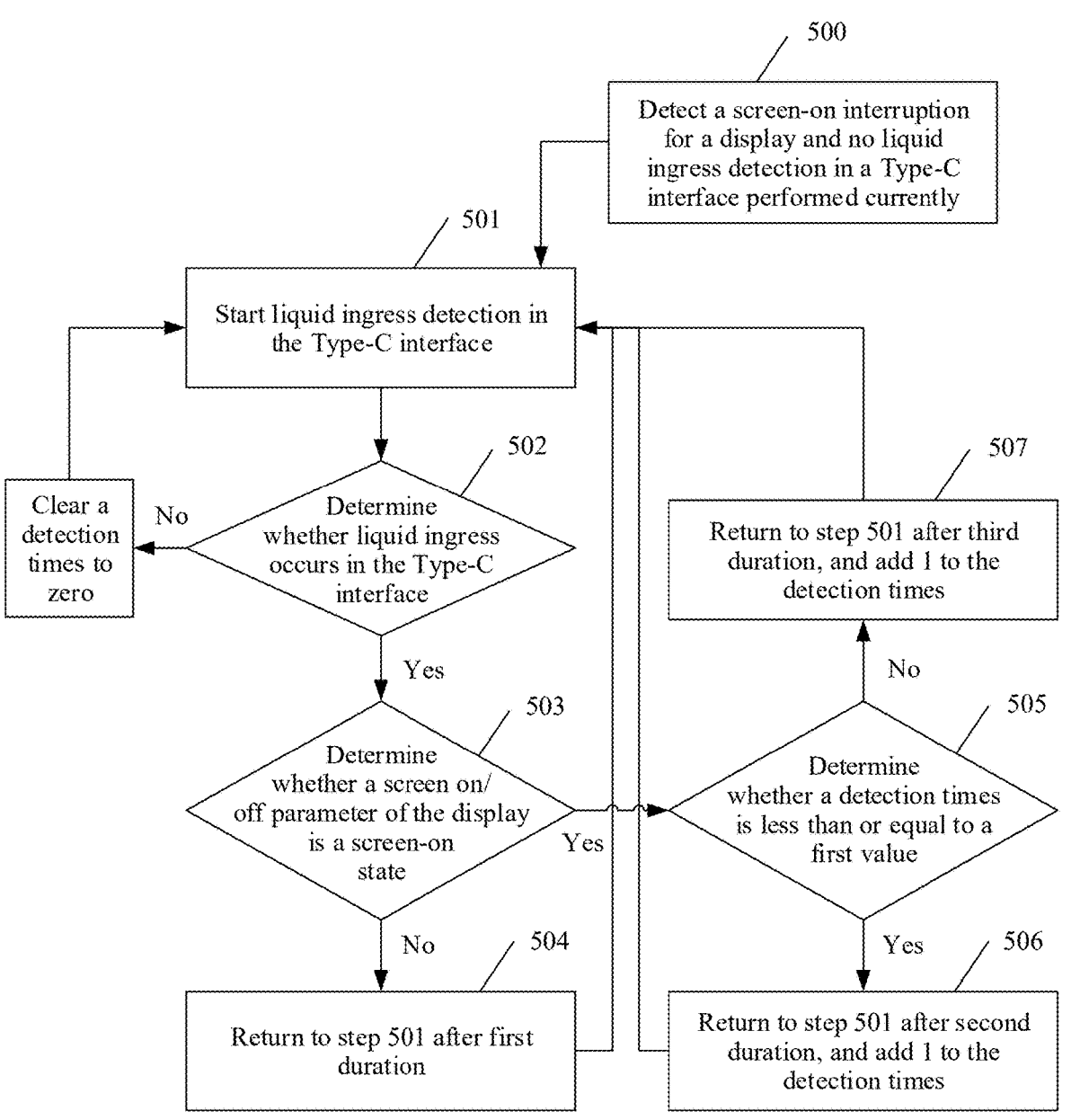
FIG. 5 is a schematic flowchart of a method for controlling liquid ingress detection according to an embodiment of this application.

FIG. 5 is a flowchart of a method for controlling liquid ingress detection according to an embodiment of this application. The method may be performed by the processor 360. As shown in FIG. 5, the method may include the following steps.

Step 500: If a screen-on interruption for a display is detected and liquid ingress detection in a Type-C interface is not performed currently, perform step 501.

When the display is switched from a screen-off state to a screen-on state, the screen-on interruption will be generated in the processor. At this time, step 501 may be triggered to perform the liquid ingress detection in the Type-C interface, so that a device recognition circuit may perform device recognition.

There are a plurality of conditions to trigger the display to switch from screen-off to screen-on. One possible implementation is that a connection detection circuit detects that there is a plug connected to the Type-C interface, and the plug connected to the Type-C interface may be a plug of a connection cable of another device. To this end, if the liquid ingress detection in the Type-C interface is not performed currently, step 501 may be triggered to start the liquid ingress detection in the Type-C interface, so that the device recognition circuit may recognize whether there is a device connected to the electronic device through the Type-C interface.

Step 501: Start the liquid ingress detection in the Type-C interface.

It should be noted that, for the liquid ingress detection circuit in the electronic device shown in FIG. 3, that starting the liquid ingress detection in the Type-C interface in this step may need to trigger a voltage detection circuit to perform voltage detection for a plurality of times, and this is not limited in this embodiment of this application. Here, that starting the liquid ingress detection in the Type-C interface is triggering the voltage detection circuit to start to apply a voltage to CC pins (a CC1 pin and/or a CC2 pin), performing voltage detection on the CC pins, and obtaining a detection result of the liquid ingress detection by the processor.

It should be noted that, taking the electronic device shown in FIG. 3 as an example, that starting liquid ingress detection in the Type-C interface is started by the processor to trigger the voltage detection circuit to start voltage detection, specifically, the processor may send a control signal to the voltage detection circuit to control the voltage detection circuit to start voltage detection.

Step 502: Based on a detection result of the liquid ingress detection, determine whether liquid ingress occurs in the Type-C interface, if yes, perform step 503, if no, clear a detection times to zero and return to step 501.

The detection times is used to record the number of times for which the liquid ingress detection in the Type-C interface is started after a screen on/off state parameter of the display switches from a screen-off state to a screen-on state.

It should be noted that if the detection result of the liquid ingress detection is that liquid ingress occurs in the Type-C interface, the processor may control the voltage detection circuit to stop voltage detection. In this case, the voltage detection circuit stops providing a voltage to the CC pins (the CC1 pin and/or the CC2 pin), and the voltages of the CC pins may be 0.

Step 503: Determine whether a screen on/off parameter of the display of the electronic device is a screen-on state, if yes, perform step 505, if no, perform step 504.

Step 504: Return to step 501 after first duration.

In this case, since the screen on/off parameter of the display of the electronic device is a screen-off state, that is, the screen is off, it is possible to return to step 501 after the first duration, to restart the liquid ingress detection in the Type-C interface. Therefore, not only the liquid ingress detection in the Type-C interface can be performed, but also another device (e.g., an OTG device or a headset) that may be connected to a Type-C interface after previous liquid ingress detection in the Type-C interface based on the voltages applied to the CC pins by the voltage detection circuit can be recognized.

Step 505: Determine whether the detection times is less than or equal to a first value, if yes, perform step 506, if no, perform step 507.

Step 506: Return to step 501 after second duration, and add 1 to the detection times.

In this case, since the screen on/off parameter of the display of the electronic device is a screen-on state and the detection times is less than or equal to the first value, the screen-on state may be caused by the Type-C interface connected to a plug of a data cable of another device, so that it is possible to return to step 501 after the second duration, to restart the liquid ingress detection in the Type-C interface. Therefore, not only the liquid ingress detection in the Type-C interface can be performed, but also another device (e.g., an OTG device or a headset) that may be connected to a Type-C interface after previous liquid ingress detection in the Type-C interface based on the voltages applied to the CC pin by the voltage detection circuit can be recognized.

Step 507: Return to step 501 after third duration, and add 1 to the detection times.

In this case, since the screen on/off parameter of the display of the electronic device is a screen-on state and the detection times is greater than the first value, the screen-on state is not caused by the Type-C interface connected to a plug of a data cable of another device, so that it is possible to return to step 501 after the third duration, to restart the liquid ingress detection in the Type-C interface. Therefore, not only the liquid ingress detection in the Type-C interface can be performed, but also another device (e.g., an OTG device or a headset) that may be connected to a Type-C interface after previous liquid ingress detection in the Type-C interface based on the voltages applied to the CC pin by the voltage detection circuit can be recognized.

Optionally, the first duration is greater than or equal to the third duration, and the third duration is greater than the second duration. It should be noted that, for a magnitude relationship between the first duration, the second duration, and the third duration herein, starting positions for calculation of the first duration, the second duration, and the third duration are the same. For example, the starting position for calculation may start from starting the liquid ingress detection in the Type-C interface in step 501.

In the method shown in FIG. 5, when liquid ingress is detected in the Type-C interface, next liquid ingress detection in the Type-C interface is started at different duration intervals when the display is in the scenarios of screen on, screen off and screen on/off switching. Therefore, not only the liquid ingress detection in the Type-C interface can be performed to alleviate a problem of serious corrosion of the CC pins caused by continuous liquid ingress detection in the Type-C interface when liquid ingress occurs in the Type-C interface, but also the device connected to the Type-C interface can be recognized timely when liquid ingress occurring in the Type-C interface is recognized.

Take the liquid ingress detection circuit shown in FIG. 4 as an example, if an A-C cable is connected to the Type-C interface, the processor may determine the liquid ingress detection result as liquid ingress occurs in the Type-C interface due to the A-C cable, to trigger a false alarm of liquid ingress, causing the electronic device (such as a cell phone) to stop applying voltages to the CC pins. In this case, the electronic device cannot detect whether there is another device connected to the CC pin. When a user removes a plug of the A-C cable from a device such as an OTG device or a digital headset, the user perceives a problem of slow recognition of the OTG device or digital headset. This problem can be solved by performing the foregoing method for controlling liquid ingress detection, so that the OTG device or digital headset connected to the Type-C interface may be recognized timely.

It should be noted that the CC pins in the foregoing embodiments may also be replaced with other data pins, such as a SBU pin, that is, the liquid ingress detection is performed by detecting an impedance between the SBU pin and the GND pin and the device recognition is performed through the SBU pin. This is not limited in the embodiments of this application.

In the embodiments herein, "at least one" refers to one or more, and "a plurality" refers to two or more. "and/or" describes an association relationship for describing associated objects and represents that three relationships may exist. For example, A and/or B may represent the following three cases: only A exists, both A and B exist, and only B exists. A or B may be singular or plural. The character "/" generally indicates an "or" relationship between associated objects before and after the character. "at least one of the following" or a similar expression thereof refers to any combination of these items, including a single item or any combination of a plurality of items. For example, at least one of a, b, or c may represent a, b, c, "a and b", "a and c", "b and c", or "a, b, and c", where a, b, and c may be singular or plural.

The foregoing descriptions are merely specific implementations of this application, and any modification or replacement readily figured out by a person skilled in the art within the technical scope disclosed in this application shall fall within the protection scope of this application. The protection scope of this application shall be subject to the protection scope of the claims.

What is claimed is:

1. A method for controlling liquid ingress detection, applied to an electronic device, wherein the electronic device comprises a Type-C interface, a liquid ingress detection circuit, and a device recognition circuit, the liquid ingress detection circuit is configured to perform liquid ingress detection in the Type-C interface by applying a voltage to first data pins of the Type-C interface, and the device recognition circuit is configured to recognize a device connected to the Type-C interface on a condition that voltages are applied to the first data pins; and the method comprises:

controlling the liquid ingress detection circuit to start the liquid ingress detection in the Type-C interface;

stopping applying the voltage to the first data pins when a detection result of the liquid ingress detection is that liquid ingress occurs in the Type-C interface, and obtaining a first parameter of a screen of the electronic device;

when the first parameter of the screen is a screen-off state, controlling the liquid ingress detection circuit to start next liquid ingress detection in the Type-C interface after first duration; and when the first parameter of the screen is a screen-on state, controlling the liquid ingress detection circuit to start next liquid ingress detection in the Type-C interface after second duration; and the first duration being greater than the second duration.

2. The method for controlling liquid ingress detection according to claim 1, wherein before controlling the liquid ingress detection circuit to start next liquid ingress detection in the Type-C interface after second duration, the method further comprises:

obtaining a detection times, wherein the detection times is used to record, when the first parameter of the screen is the screen-on state, a number of times for which the liquid ingress detection circuit is controlled to start the liquid ingress detection in the Type-C interface; and determining that the detection times is less than or equal to a preset first value.

3. The method for controlling liquid ingress detection according to claim 2, wherein the method further comprises:

determining that the detection times is greater than the preset first value, and controlling the liquid ingress detection circuit to start next liquid ingress detection in the Type-C interface after third duration, wherein the third duration is greater than the second duration and less than or equal to the first duration.

4. The method for controlling liquid ingress detection according to claim 1, wherein the method further comprises:

when the detection result of the liquid ingress detection is that no liquid ingress occurs in the Type-C interface, controlling the liquid ingress detection circuit to start next liquid ingress detection in the Type-C interface.

5. The method for controlling liquid ingress detection according to claim 2, wherein the method further comprises:

when the detection result of the liquid ingress detection is that no liquid ingress occurs in the Type-C interface, clearing the detection times to zero.

6. The method for controlling liquid ingress detection according to claim 1, wherein the method further comprises:

when a screen-on interruption is detected by a preset application, controlling the liquid ingress detection circuit to start the liquid ingress detection in the Type-C interface.

7. The method for controlling liquid ingress detection according to claim 1, wherein the first data pins are CC pins.

8. An electronic device, comprising:

a Type-C interface;

a liquid ingress detection circuit configured to perform liquid ingress detection in the Type-C interface by applying a voltage to first data pins of the Type-C interface;

a device recognition circuit configured to recognize a device connected to the Type-C interface in response to determining that voltages are applied to the first data pins; and a processor configured to perform a method for controlling liquid ingress detection, the method comprising:

controlling the liquid ingress detection circuit to start the liquid ingress detection in the Type-C interface, stopping applying the voltage to the first data pins when a detection result of the liquid ingress detection is that liquid ingress occurs in the Type-C interface, and obtaining a first parameter of a screen of the electronic device, when the first parameter of the screen is a screen-off state, controlling the liquid ingress detection circuit to start next liquid ingress detection in the Type-C interface after first duration, and when the first parameter of the screen is a screen-on state, controlling the liquid ingress detection circuit to start next liquid ingress detection in the Type-C interface after second duration; and the first duration being greater than the second duration.

9. The electronic device according to claim 8, wherein before controlling the liquid ingress detection circuit to start next liquid ingress detection in the Type-C interface after second duration, the method further comprises:

obtaining a detection times, wherein the detection times is used to record, when the first parameter of the screen is the screen-on state, a number of times for which the liquid ingress detection circuit is controlled to start the liquid ingress detection in the Type-C interface; and determining that the detection times is less than or equal to a preset first value.

10. The electronic device according to claim 9, wherein the method further comprises:

determining that the detection times is greater than the preset first value, and controlling the liquid ingress detection circuit to start next liquid ingress detection in the Type-C interface after third duration, wherein the third duration is greater than the second duration and less than or equal to the first duration.

11. The electronic device according to claim 8, wherein the method further comprises:

when the detection result of the liquid ingress detection is that no liquid ingress occurs in the Type-C interface, controlling the liquid ingress detection circuit to start next liquid ingress detection in the Type-C interface.

12. The electronic device according to claim 9, wherein the method further comprises:

when the detection result of the liquid ingress detection is that no liquid ingress occurs in the Type-C interface, clearing the detection times to zero.

13. The electronic device according to claim 8, wherein the method further comprises:

when a screen-on interruption is detected by a preset application, controlling the liquid ingress detection circuit to start the liquid ingress detection in the Type-C interface.

14. The electronic device according to claim 8, wherein the first data pins are CC pins.

\* \* \* \* \*